United States Patent
Lin et al.

[11] Patent Number: 6,027,371
[45] Date of Patent: Feb. 22, 2000

[54] ELECTRICAL CONNECTOR

[75] Inventors: Chung-Long Lin, Taipei; Rong-Yuh Leu, Yung-Ho; Ming-Chung Ko, Tu-Chen, all of Taiwan

[73] Assignee: Hon Hai Precision Ind. Co., Ltd., Taipei Hsien, Taiwan

[21] Appl. No.: 09/092,231

[22] Filed: Jun. 5, 1998

[30] Foreign Application Priority Data

Jun. 7, 1997 [TW] Taiwan .................................. 86209582

[51] Int. Cl.⁷ .................................................. H01R 13/60
[52] U.S. Cl. ............................................. 439/567; 439/571
[58] Field of Search .................................. 439/567, 570, 439/571; 361/785

[56] References Cited

U.S. PATENT DOCUMENTS 5,489,219  2/1996  Fabian ..................................... 439/567

*Primary Examiner*—Michael L. Gellner
*Assistant Examiner*—Antoine Ngandjui

[57] ABSTRACT

An electrical connector connected to a printed circuit board includes an insulative housing, a plurality of contacts received in the housing, a spacer member including a body portion projecting from a mounting surface of the housing and a neck portion projecting from a top surface of the body portion, and a board lock member extending from the neck portion of the spacer member for engaging with a board lock reception hole defined in the printed circuit board. The neck portion of the spacer member is received in the board lock reception hole of the printed circuit board for preventing solder from flowing from a lower surface of the printed circuit board to an upper surface thereof via the board lock reception hole. The top surface of the body portion of the spacer abuts against the upper surface of the printed circuit board thereby forming a space between the mounting surface of the connector and the upper surface of the printed circuit board.

6 Claims, 3 Drawing Sheets

ELECTRICAL CONNECTOR

BACKGROUND OF THE INVENTION

1. Field of The Invention

The present invention relates to an electrical connector which has a special board lock structure for firmly securing to a printed circuit board and preventing solder/solder agent from shorting/adhering to contacts of the connector during a wave soldering procedure.

2. The Prior Art

Conventional electrical connectors are connected to a printed circuit board by means of soldering. However, this direct connection between the connector and the printed circuit board is apt to be damaged due to external impact or vibration action on the connector. Moreover, during a wave soldering procedure, a gap or space is apt to be formed between a mounting surface of the connector and the printed circuit board, thus the connector floats from the contacting surface of the printed circuit board after the wave soldering procedure. To address this problem, some connectors are installed with a securing device attached thereto for further securing the connector to the printed circuit board in addition to direct soldering. Taiwan Patent Nos. 80204998, 81212698, 81211344, 83200853, 83205670 disclose securing devices made of nonconductive material attached to the connector. Taiwan Patent Nos. 79203382, 80213095, 81201057, 81213628, 82216079, 84101384 disclose securing devices made of metal attached to the connector. However, such securing devices share two disadvantages. First, solder tends to flow to a top surface of the printed circuit board via the securing device and cause a short circuit between contacts of the connector during a wave soldering procedure. Second, before the wave soldering procedure, the printed circuit board together with the components mounted thereon must pass through a solder agent sink for adhering the solder agent to the soldering face of the printed circuit board. However, some of the solder agent will flow the other surface of the printed circuit board, and portions of the misdirected solder agent will adhere to contacting portions of the contacts and adversely affect the conductivity thereof.

To solve the above problems, some manufacturers increase the depth of the hole which receives and retains the securing device for preventing the solder or solder agent from flowing through the hole via the securing device. The tip portion of the securing device may be bent to obstruct the path through which the solder or solder agent flows to the other surface of the printed circuit board. Alternatively, water is used to rinse the printed circuit board thereby eliminating any solder agent attached to the contacting portions of the contacts. Cutouts can be formed in two sides of the end portion of the securing device for preventing the solder or solder agent from flowing through the hole along the securing device.

The above methods are complicated and cost inefficient, therefore it is requisite to provide a new structure for a securing device which fully secures the connector to a printed circuit board while obstructing the solder or solder agent from flowing through a hole in a PCB via the securing device.

SUMMARY OF THE INVENTION

The primary purpose of the present invention is to provide an improved electrical connector which comprises at least a securing device which fully secures the connector to a printed circuit board while obstructing solder or solder agent from flowing through to another side of the printed circuit board via the securing device.

In accordance with one aspect of the present invention, an electrical connector is provided for solving the above problems, wherein the connector is connected to a printed circuit board which defines at least a board lock reception hole for engagement purpose. The electrical connector comprises an insulative housing, a plurality of contacts received in the housing, a spacer member including a body portion projecting from a mounting surface of the housing and a neck portion projecting from a top surface of the body portion, and a board lock member extending from the neck portion of the spacer member for engaging with the board lock reception hole of the printed circuit board. The neck portion of the spacer member is received in the board lock reception hole of the printed circuit board for obstructing a path of solder from flowing from a lower surface of the printed circuit board to an upper surface thereof via the board lock reception hole. Meanwhile, the top surface of the body portion of the spacer abuts against the upper surface of the printed circuit board thereby forming a space between the mounting surface of the connector and the upper surface of the printed circuit board.

DETAILED DESCRIPTION OF THE PREFERRED EMBODIMENTS

Figure 1:
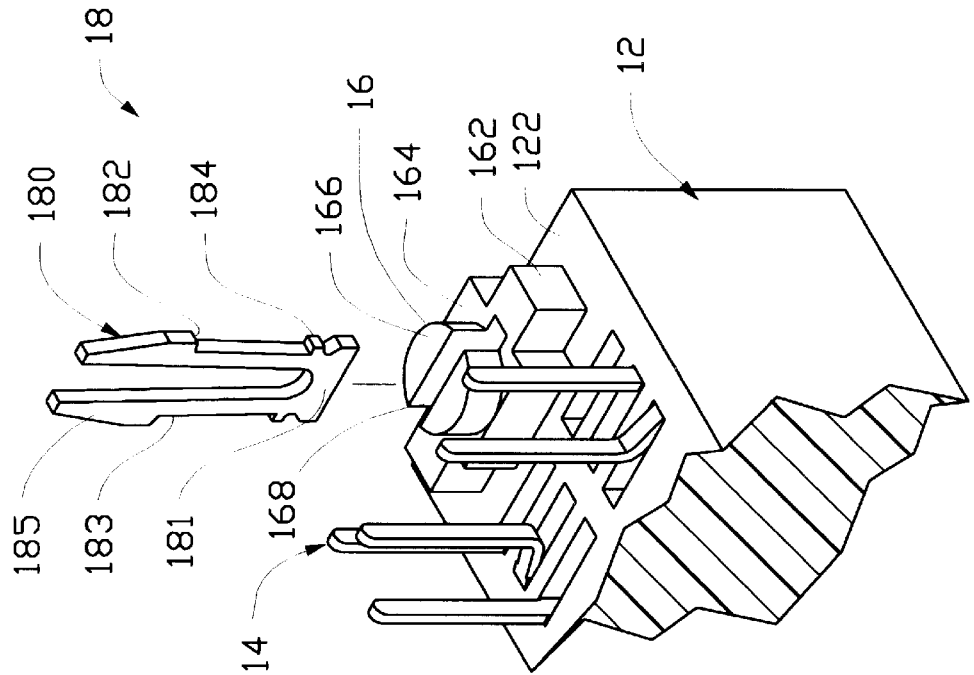
FIG. 1 is a partial schematic view of an electrical connector in accordance with the present invention.
Figure 2:
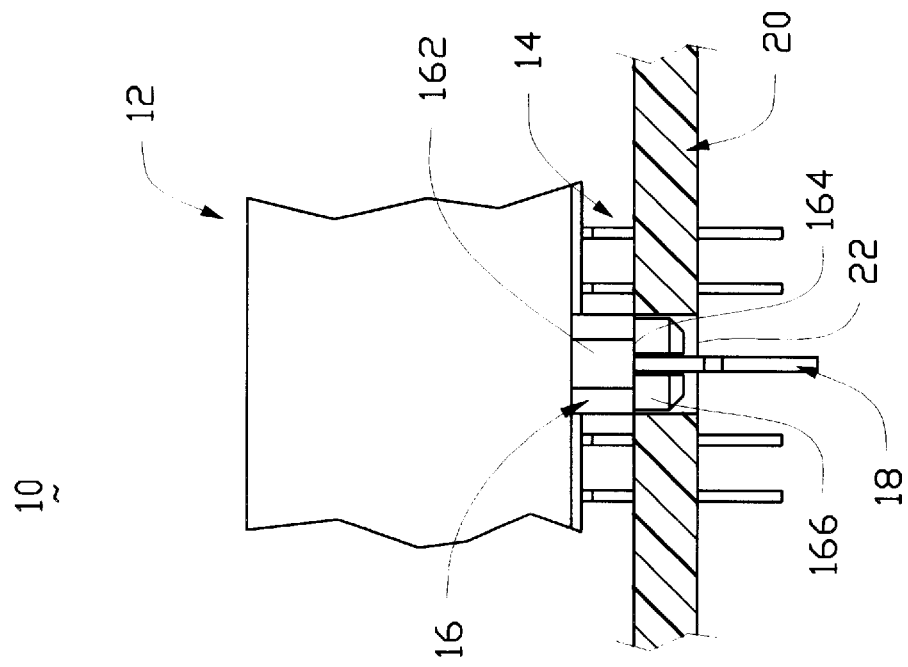
FIG. 2 is a front view of the connector of FIG. 1 mounted on a printed circuit board.
Figure 3:
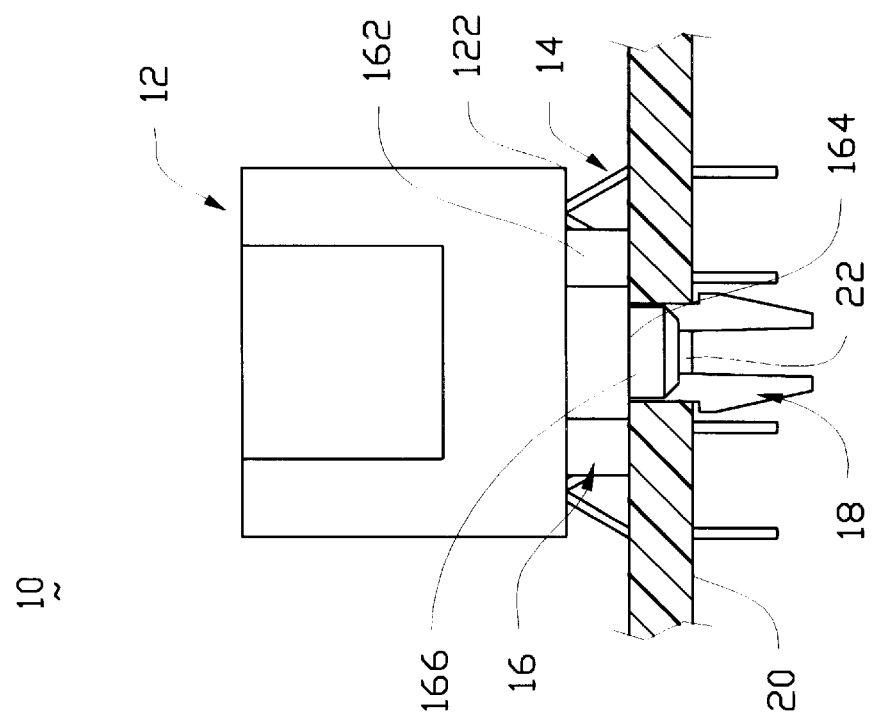
FIG. 3 is a side view of the connector of FIG. 1 mounted on a printed circuit board.

Referring to FIGS. 1, 2 and 3, an electrical connector 10 in accordance with the present invention comprises an insulative housing 12, a plurality of contacts 14 received in the housing 12, a spacer member 16 integrated with the housing 12, and a board lock member 18 extending from the spacer member 16. The housing 12 comprises a mounting surface 122 for mounting to a printed circuit board 20. The contacts 14 are partially retained in the housing 12 and partially extend outward from the mounting surface 122 for connection to the printed circuit board 20. The spacer 16 comprises a body portion 162 extending from the mounting surface 122 of the housing 12, and a neck portion 166 extending from a top surface 164 of the body portion 162 and received in a board lock reception hole 22 of the printed circuit board 20.

Figure 4:
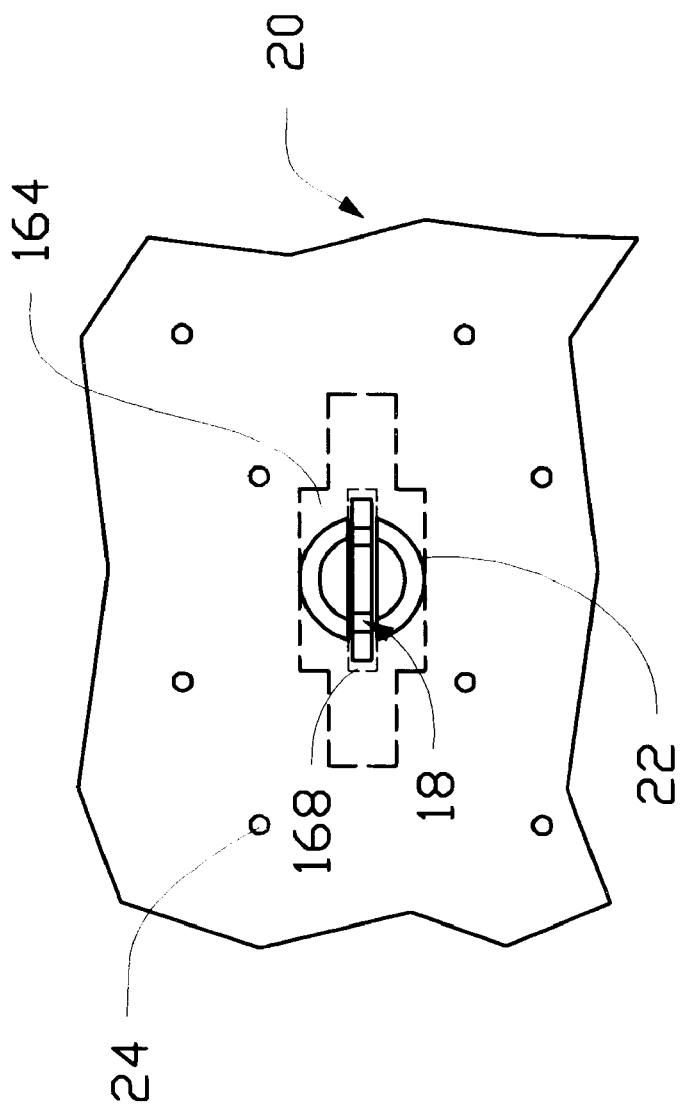
FIG. 4 is a bottom view of FIG. 2.

Referring to FIG. 4, the top surface 164 of the body portion 162 is sized to sufficiently cover the board lock reception hole 22 of the printed circuit board 20 when the neck portion 166 is received in the board lock reception hole 22. Since the top surface 164 of the body portion 162 of the (spacer member 16) can fully obstruct the board lock reception hole 22 of the printed circuit board 20, during the wave soldering procedure solder or solder agent is fully prevented from flowing from a lower surface to an upper surface of the printed circuit board 20 via the spacer member 16.

A slit 168 defined in the neck portion 166 receives and retains the board lock member 18 therein. The board lock member 18 is a U-shaped metal structure which includes two branches 180 connected by an intermediate portion 181 which forms barbs 184 at lateral ends thereof for engagement with the slit 168 when the board lock member 18 is retained therein. Each branch 180 has a straight portion 183, a tapered end 185, and a shoulder portion 182 formed therebetween. Particularly referring to FIG. 3, the tapered end 185 of the branch 180 facilitates penetration of the board lock reception hole 22, the shoulder portion 182 abuts against the lower surface of the printed circuit board 20, and the top surface 164 of the body portion 162 abuts against the upper surface of the printed circuit board 20.

Particularly referring to FIGS. 2 and 4, when the connector 10 is mounted on the printed circuit board 20, the board lock member 18 is engaged with an inner periphery of the board lock reception hole 22, the contacts 14 are received in corresponding through holes 24 of the printed circuit board 20, and the top surface 164 of the body portion 162 abuts against the top surface of the printed circuit board 20. Thus, a space is formed between the mounting surface 122 of the housing 12 and the upper surface of the printed circuit board 20. The space can effectively prevent solder or solder agent from flowing via the contacts 14 resulting in a short circuit between contacts or intermittent contact of contacting portion of each contact 14.

With the above structure, during a wave soldering procedure, the solder agent/solder will not flow through the board lock hole 22 and adversely affect the normal operation of the contacts 14, Nor will the solder agent/solder flow directly through the contacts 14 causing a short circuit or intermittent connection of each contact 14 due to the space between the mounting surface 122 of the connector 10 and the upper surface of the printed circuit board 20. Therefore, this invention can effectively eliminate the problems encountered in the prior art.

While the present invention has been described with reference to a specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. An electrical connector connected to a printed circuit board which defines at least a board lock reception hole, the electrical connector comprising an insulative housing, a plurality of contacts received in the housing, a spacer member including a body portion projecting from a mounting surface of the housing and a neck portion projecting from a top surface of the body portion, and a board lock member extending from the neck portion of the spacer member for engaging with the board lock reception hole of the printed circuit board; whereby the neck portion of the spacer member is received in the board lock reception hole of the printed circuit board for preventing solder from flowing from a lower surface of the printed circuit board to an upper surface thereof via the board lock reception hole, wherein the top surface of the body portion of the spacer abuts against the upper surface of the printed circuit board thereby forming a space between the mounting surface of the connector and the upper surface of the printed circuit board.

2. The electrical connector as claimed in claim 1, wherein the contacts are partially retained in the housing and partially extend outward from the mounting surface of the housing for connection to the printed circuit board.

3. The electrical connector as claimed in claim 1, wherein the top surface of the body portion of the spacer member is sized to sufficiently cover the board lock reception hole of the printed circuit board when the neck portion is received in the board lock reception hole of the printed circuit board.

4. The electrical connector as claimed in claim 1, wherein the neck portion of the spacer member defines a slit therein for receiving and retaining the board lock member therein.

5. The electrical connector as claimed in claim 1, wherein the board lock member is a U-shaped metal structure which includes two branches connected by an intermediate portion which forms barbs at lateral ends thereof for engagement with the slit.

6. The electrical connector as claimed in claim 5, wherein each branch of the board lock member has a straight portion, a tapered end, and a shoulder portion formed therebetween, and wherein the tapered end of the branch facilitates penetration of the board lock member into the board lock reception hole, the shoulder portion abuts against the lower surface of the printed circuit board, and the top surface of the body portion abuts against the upper surface of the printed circuit board and cover the board lock reception hole.

* * * * *